(12) United States Patent
Miyata et al.

(10) Patent No.: US 8,269,353 B2
(45) Date of Patent: Sep. 18, 2012

(54) SEMICONDUCTOR DEVICE HAVING A PLURALITY OF ADHESION AREA PATTERNS AND ONE OR MORE NON-ADHESION AREA PATTERNS

(75) Inventors: Koji Miyata, Osaka (JP); Hiroyuki Nakanishi, Osaka (JP); Masahiro Okita, Osaka (JP); Kazuaki Tatsumi, Osaka (JP); Masato Yokobayashi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 230 days.

(21) Appl. No.: 12/635,000

(22) Filed: Dec. 10, 2009

(65) Prior Publication Data
US 2010/0148311 A1 Jun. 17, 2010

(30) Foreign Application Priority Data
Dec. 11, 2008 (JP) ................. 2008-315752

(51) Int. Cl.
*H01L 23/48* (2006.01)
*H01L 23/52* (2006.01)
*H01L 29/40* (2006.01)

(52) U.S. Cl. ........ 257/778; 257/783; 257/737; 257/738; 257/686; 438/108; 438/109; 438/118

(58) Field of Classification Search .................. 257/777, 257/778, 737, 738, 678, 686, 734, 779, 780, 257/781, 782, 783, 784, 786; 438/108, 109, 438/106, 118, 119
See application file for complete search history.

(56) References Cited

U.S. PATENT DOCUMENTS

| 5,677,575 A * | 10/1997 | Maeta et al. ............ 257/778 |
| 6,617,521 B1 | 9/2003 | Saito et al. |
| 6,853,086 B1 | 2/2005 | Nakayama |
| 2003/0109126 A1 * | 6/2003 | Terasawa et al. ........... 438/612 |

FOREIGN PATENT DOCUMENTS

| JP | 2000-294896 A | 10/2000 |
| JP | 2001-319943 A | 11/2001 |
| JP | 2002-164627 A | 6/2002 |
| JP | 2003-007769 A | 1/2003 |
| WO | 00/26959 A1 | 5/2000 |

* cited by examiner

*Primary Examiner* — Ha Tran T Nguyen
*Assistant Examiner* — Thanh Y Tran
(74) *Attorney, Agent, or Firm* — Nixon & Vanderhye P.C.

(57) ABSTRACT

Patterns provided on a surface of a substrate include an adhesion area pattern and one or more non-adhesion area patterns. A chip electrode on a backside of a semiconductor chip is attached to the adhesion area pattern by a conductive adhesive. Consequently, an area of patterns subjected to gold plating that is stable in a steady state is smaller in a substrate of the present invention than in a conventional substrate, resulting in reduction in costs. Further, the chip electrode is attached to the adhesion area pattern by a conductive adhesive in a liquid form. Consequently, a semiconductor device of the present invention allows reducing use of an expensive conductive adhesive compared with a conventional semiconductor device, resulting in reduction in costs.

9 Claims, 8 Drawing Sheets

SEMICONDUCTOR DEVICE HAVING A PLURALITY OF ADHESION AREA PATTERNS AND ONE OR MORE NON-ADHESION AREA PATTERNS

This Nonprovisional application claims priority under 35 U.S.C. §119(a) on Patent Application No. 2008-315752 filed in Japan on Dec. 11, 2008, the entire contents of which are hereby incorporated by reference.

TECHNICAL FIELD

The present invention relates to a semiconductor device.

BACKGROUND ART

Figure 8:
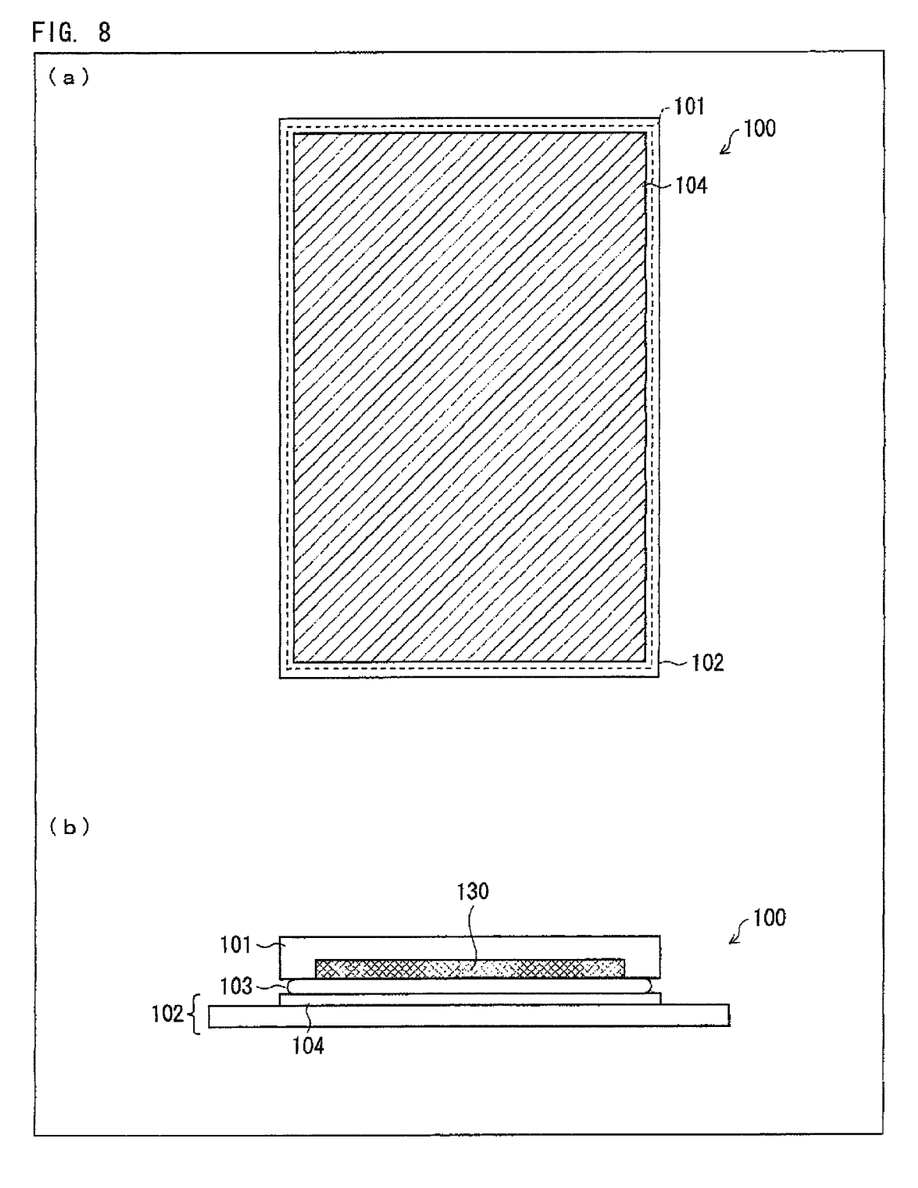
FIG. 8 is a drawing showing a configuration of a conventional semiconductor device. (a) of FIG. 8 is a plane drawing showing the conventional semiconductor device. (b) of FIG. 8 is an elevation drawing showing the conventional semiconductor device.

FIG. 8 is a drawing showing a configuration of a conventional semiconductor device 100. (a) of FIG. 8 is a plane drawing showing the conventional semiconductor device 100. (b) of FIG. 8 shows an elevation drawing showing the conventional semiconductor device 100.

As shown in FIG. 8, it is assumed that out of semiconductor chips having a chip electrode on their backsides, a semiconductor chip 101 with a large area whose length of one side is more than 10 mm is attached to a circuit substrate 102 with an electrode (hereinafter merely referred to as substrate 102) by a conductive adhesive 103 in a liquid form. In this case, if the conductive adhesive 103 is applied to a whole area of the substrate 102 which is substantially equal to the size of the semiconductor chip 101, it is necessary to use a large amount of an expensive conductive adhesive.

SUMMARY OF INVENTION

Technical Problem

As described above, in the conventional semiconductor device 100 in FIG. 8, if the conductive adhesive 103 is applied to a whole area of the substrate 102 which is substantially equal to the size of the semiconductor chip 101 on which a chip electrode 130 is provided, it is necessary to use a large amount of an expensive conductive adhesive.

Further, in the conventional semiconductor device 100 in FIG. 8, it is often that a pattern 104 on the surface of the circuit substrate 102 with an electrode is subjected to gold plating that is stable in a steady state. In this case, if the pattern 104 is provided on the whole area substantially equal to the size of the semiconductor chip 101, the costs for the circuit substrate 102 with an electrode increase.

The present invention was made in view of the foregoing problems. An object of the present invention is to provide a semiconductor device made at lower costs by reducing both the costs of the substrate and use of a conductive adhesive.

Solution to Problem

In order to solve the foregoing problems, a semiconductor device of the present invention includes: a semiconductor chip having a chip electrode on a backside of the semiconductor chip; and a substrate having patterns on a surface of the substrate, the backside of the semiconductor chip facing the surface of the substrate, the patterns including an adhesion area pattern and one or more non-adhesion area patterns, and the chip electrode being attached to the adhesion area pattern by a conductive adhesive.

With the invention, the patterns are not provided on a whole area of the substrate which is substantially equal to the size of the semiconductor chip, and include the adhesion area pattern and the one or more non-adhesion area patterns. Consequently, the total of areas of the adhesion area pattern and the one or more non-adhesion area patterns is smaller than an area of patterns provided on a whole area of the substrate which is substantially equal to the size of a conventional semiconductor chip.

Consequently, an area of patterns subjected to gold plating that is stable in a steady state is smaller in the above substrate than in a conventional substrate. Accordingly, the above substrate allows reducing costs compared with the conventional substrate.

Further, the chip electrode provided on the backside of the semiconductor chip is attached to the adhesion area pattern by the conductive adhesive in a liquid form. Accordingly, in the semiconductor device, the chip electrode is attached to the adhesion area pattern and at the same time use of the expensive conductive adhesive is reduced compared with a case of a conventional semiconductor device. This allows reducing the costs.

ADVANTAGEOUS EFFECTS OF INVENTION

As described above, in the semiconductor device of the present invention, patterns include an adhesion area pattern and one or more non-adhesion area patterns, and a chip electrode is attached to the adhesion area pattern by a conductive adhesive.

Consequently, it is possible to provide a semiconductor device made at lower costs by reducing both the costs of the substrate and use of a conductive adhesive.

DESCRIPTION OF EMBODIMENTS

The following explains one embodiment of the present invention with reference to Examples 1-4 and FIGS. 1-7.

Figure 1:
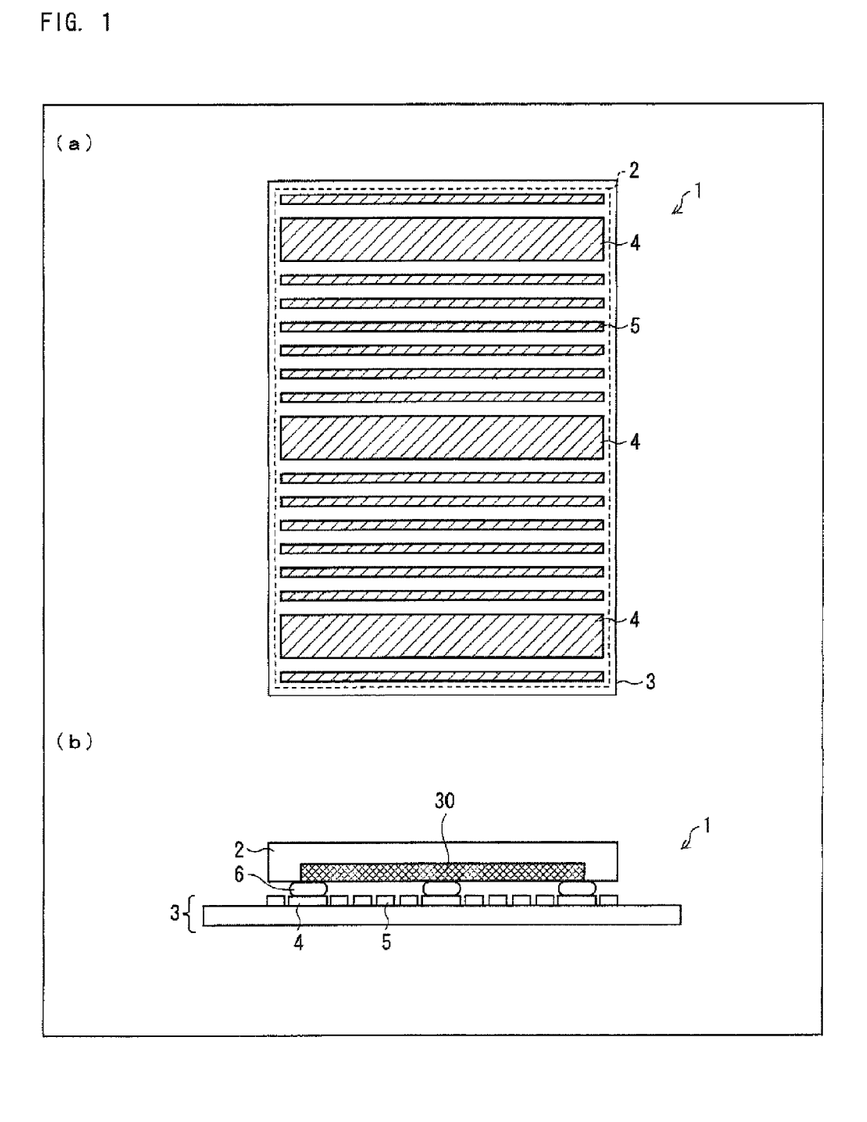
FIG. 1 is a drawing showing a configuration of a semiconductor device in accordance with one embodiment of the present invention. (a) of FIG. 1 is a plane drawing showing the semiconductor device in accordance with one embodiment of the present invention. (b) of FIG. 1 is an elevation drawing showing the semiconductor device in accordance with one embodiment of the present invention.

FIG. 1 is a drawing showing a configuration of a semiconductor device 1 in accordance with one embodiment of the present invention. (a) of FIG. 1 is a plane drawing showing the semiconductor device 1 in accordance with one embodiment of the present invention. (b) of FIG. 1 is an elevation drawing showing the semiconductor device 1 in accordance with one embodiment of the present invention.

The semiconductor device 1 includes: a semiconductor chip (cell) 2 having a chip electrode 30 on the backside of the semiconductor chip 2; and a substrate 3. On a surface of the substrate 3 which faces the backside of the semiconductor chip 2, an adhesion area pattern 4 and one or more non-adhesion area patterns 5 are provided.

The semiconductor device 1 is designed such that a pattern is not provided on a whole area of the substrate 3 which is substantially equal to the size of the semiconductor chip 2, and instead the adhesion area pattern 4 and the one or more non-adhesion area patterns 5 are provided. Consequently, the total of the areas of the adhesion area pattern 4 and the one or more non-adhesion area patterns 5 is smaller than the area of a pattern 104 provided on the whole area of the substrate 102 which is substantially equal to the size of the semiconductor chip 101 in FIG. 8. Accordingly, an area of a pattern subjected to gold plating that is stable in a steady state is smaller in the substrate 3 in FIG. 1 than the substrate 102 in FIG. 8. Therefore, the substrate 3 in FIG. 1 allows reducing the costs compared with the substrate 102 in FIG. 8.

The patterns provided on the substrate 3 will be detailed in Examples 1-4. Numerical values in the Examples are merely examples.

The chip electrode 30 provided on the backside of the semiconductor chip 2 is attached to the adhesion area pattern 4 by the conductive adhesive 6 in a liquid form. Accordingly, in the semiconductor device 1 in FIG. 1, the chip electrode 30 is attached to the adhesion area pattern 4 and at the same time use of the expensive conductive adhesive 6 is reduced compared with a case of the semiconductor device 100 in FIG. 8. This allows reducing the costs.

Example 1

Figure 2:
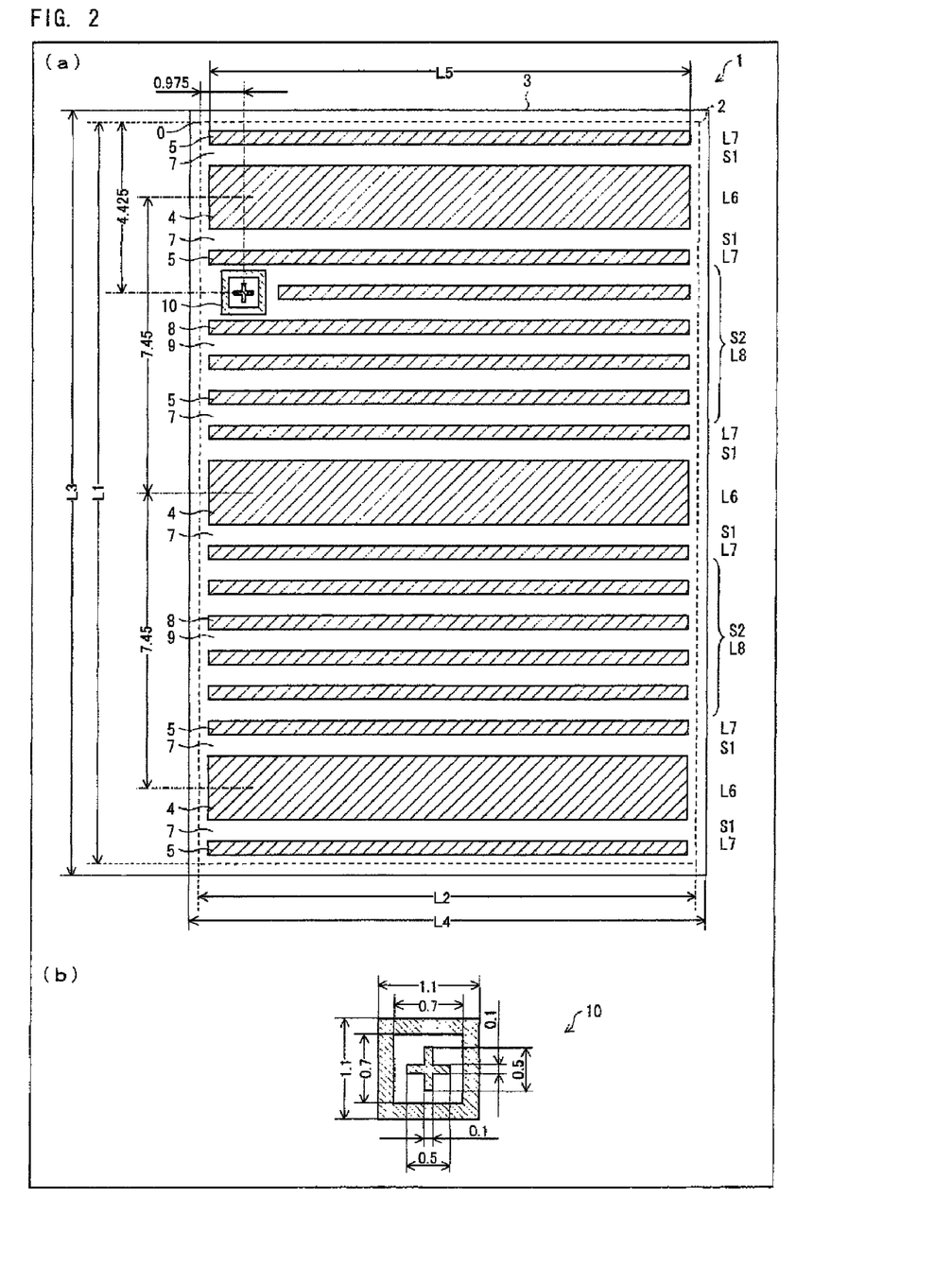
FIG. 2 is a drawing showing a configuration of a semiconductor device in accordance with one Example of the present invention. (a) of FIG. 2 is a plane drawing showing the semiconductor device in accordance with one Example of the present invention. (b) of FIG. 2 is a plane drawing showing an alignment mark in accordance with one Example of the present invention.

(a) of FIG. 2 is a plane drawing showing the semiconductor device 1 in accordance with Example 1. (b) of FIG. 2 is a plane drawing showing an alignment mark 10 in accordance with Example 1. All units of numerical values in (a) of FIG. 2 and (b) of FIG. 2 are mm (millimeter).

In (a) of FIG. 2, a length L1 of a long side of the semiconductor chip 2 is 18.75 mm. A length L2 of a short side of the semiconductor chip 2 is 12.5 mm. A length L3 of a long side of the semiconductor 3 is L3=L1+2×0.125=19 mm. A length L4 of a short side of the substrate 3 is L4=L2+2×0.125=12.75 mm.

All the lengths of long sides of an adhesion area pattern, a non-adhesion area pattern, and an inter-pattern area described below are L5, which is set such that L5=L2−2×0.125=12.25 mm.

Three adhesion area patterns 4 are provided on the substrate 3. A length of a long side of each adhesion area pattern 4 is L5, and a length L6 of a short side of each adhesion area pattern 4 is 2 mm. Two inter-pattern areas 7 are provided in such a manner as to be adjacent to two long sides, respectively, of each adhesion area pattern 4. A length of a long side of each inter-pattern area 7 is L5 and a length S1 of a short side of each inter-pattern area 7 is S1=0.5 mm.

The non-adhesion area pattern 5 is provided in such a manner as to be adjacent to a long side of each inter-pattern area 7 which long side is not adjacent to the adhesion area pattern 4. A length of a long side of the non-adhesion area pattern 5 is L5, and a length L7 of a short side of the non-adhesion area pattern 5 is L7=0.3 mm.

Two non-adhesion area patterns 5 are provided between two successive adhesion area patterns 4. Between the two non-adhesion area patterns 5, four non-adhesion area patterns 8 and five inter-pattern areas 9 are provided alternately. A length of a long side of the non-adhesion area pattern 8 is L5 and a length L8 of a short side of the non-adhesion area pattern 8 is L8=0.25 mm. A length of a long side of the inter-pattern area 9 is L5 and a length S2 of a short side of the inter-pattern area 9 is S2=0.57 mm.

In the semiconductor device 1, when the area of the semiconductor chip 2 is regarded as 100%, the total of the areas of the adhesion area patterns 4, the non-adhesion area patterns 5, and the non-adhesion area patterns 8 is approximately 52%. Whereas in the substrate 102 in FIG. 8, the area of the pattern 104 the area of the semiconductor chip 101=100%. Therefore, an area of a pattern subjected to gold plating that is stable in a steady state is smaller in the substrate 3 in FIG. 2 than in the substrate 102 in FIG. 8. Consequently, the substrate 3 in FIG. 2 allows reducing the costs compared with the substrate 102 in FIG. 8.

Further, in the semiconductor device 1, the conductive adhesive 6 in a liquid form is applied to only the adhesion area pattern 4. Consequently, in the semiconductor device 1 in FIG. 1, use of the expensive conductive adhesive 6 is reduced compared with a case of the semiconductor device 100 in FIG. 8. Therefore, the semiconductor device 1 in FIG. 1 allows reducing the costs.

It is assumed that the conductive adhesive 6 in a liquid form is applied to the adhesion area patterns 4 in the substrate 3 having the patterns and the inter-pattern areas as above. In this case, the conductive adhesive 6 that has leaked out of the adhesion area pattern 4 flows into inter-pattern areas 7 provided at both sides of the adhesion area pattern 4, respectively, and is blocked by the non-adhesion area patterns 5 each provided at a further side of the inter-pattern area 7 from the adhesion area pattern 4.

In this manner, the non-adhesion area patterns 5 serve as dams for confining and keeping back the conductive adhesive 6. Consequently, the conductive adhesive 6 does not flow out of the semiconductor chip 2. This allows preventing defective appearance of the semiconductor device 1 and allows preventing electric defect caused by touching of an electrode outside the substrate 3 with the conductive adhesive 6.

Further, since the non-adhesion area patterns 8 are provided, it is possible to prevent inconvenient breakage of the semiconductor chip 2 due to distortion thereof.

Further, the alignment mark 10 is provided on the substrate 3 in such a manner that the center of the alignment mark 10 is positioned 4.425 mm away from a point O on the substrate 3 in a long side direction of the substrate 3 and 0.975 mm away from the point O in a short side direction of the substrate 3. The sizes of the alignment mark 10 are shown in (b) of FIG. 2. Since the alignment mark 10 is provided, it is possible to exactly position the semiconductor chip 2 on the substrate 3.

The semiconductor device 1 is completed by attaching the semiconductor chip 2 to the substrate 3 by the conductive adhesive 6 and then sealing them by resin. The inter-pattern areas 7 and the inter-pattern areas 9 are provided in such a manner that long sides thereof with a length of L5 are parallel to short sides with a length of L4 of the substrate 3, and therefore the lengths of the long sides of the inter-pattern areas 7 and the inter-pattern areas 9 are smaller than those in a case where the long sides of the inter-pattern areas 7 and the inter-pattern areas 9 are provided in such a manner as to be parallel to long sides with a length of L3 of the substrate 3. This allows more easily filling the inter-pattern areas 7 and the inter-pattern areas 9 with resin, preventing a space from being made between the semiconductor chip 2 and the substrate 3.

Figure 3:
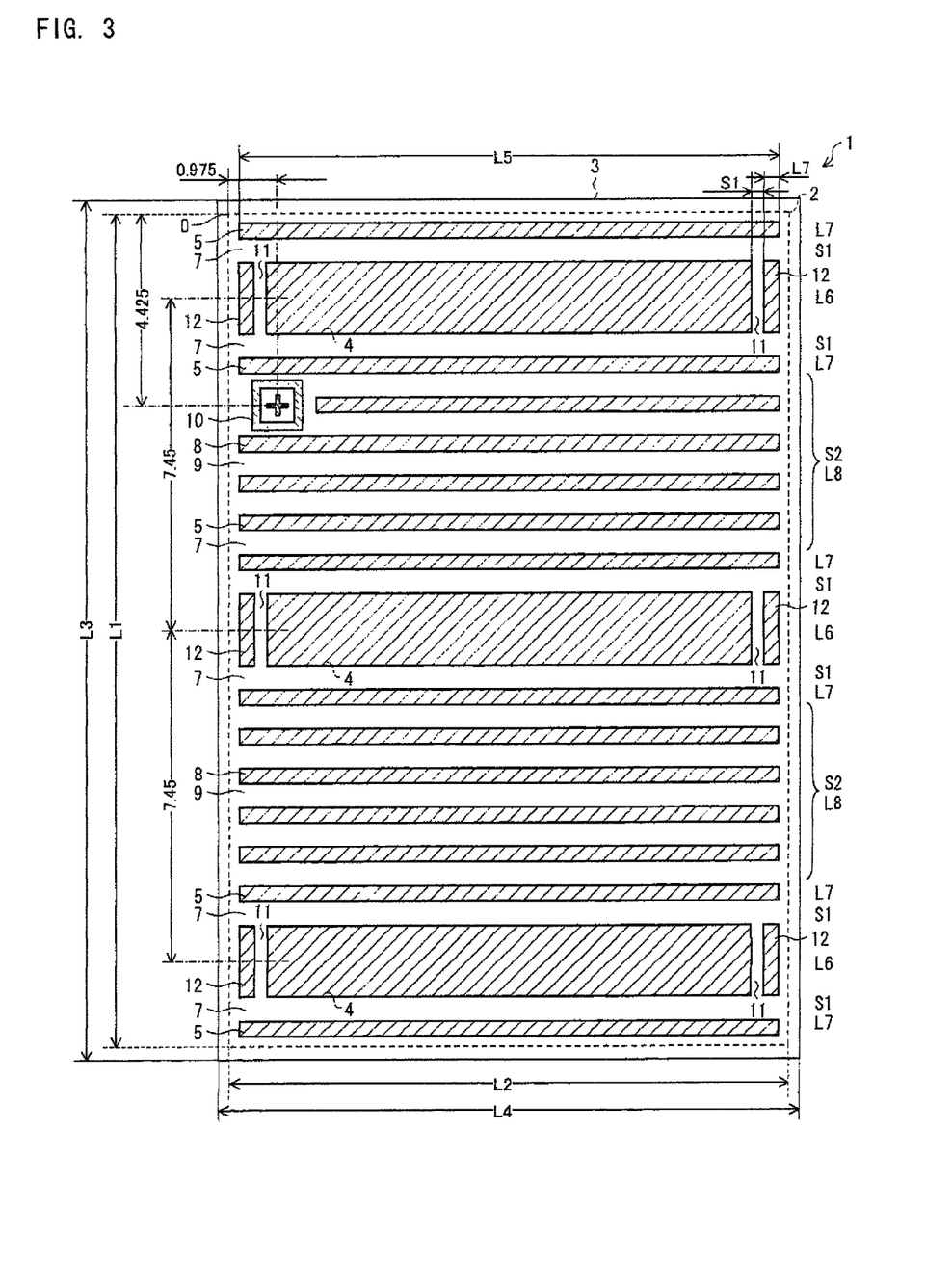
FIG. 3 is a plane drawing showing a semiconductor device in accordance with one Example of the present invention, having inter-pattern areas whose long sides are parallel to long sides of a substrate.

In the semiconductor device 1 in (a) of FIG. 2, the inter-pattern areas 7 are provided in such a manner that long sides thereof with a length of L5 are parallel to short sides with a length of L4 of the substrate 3. However, as shown in FIG. 3, in addition to the inter-pattern areas 7, inter-pattern areas 11 may be provided in such a manner that long sides with a length of L6 of the inter-pattern areas 11 are parallel to long sides with a length of L3 of the substrate 3. A length of a short side of the inter-pattern areas 11 is S1.

In this case, a non-adhesion area pattern 12 is provided in such a manner that the non-adhesion area pattern 12 and the adhesion area pattern 4 sandwich the inter-pattern area 11. A length of a long side of the non-adhesion area pattern 12 is L6 and a length of a short side of the non-adhesion area pattern 12 is L7.

As described above, by providing the inter-pattern areas 11 and the non-adhesion area patterns 12, not only the non-adhesion area patterns 5 but also the non-adhesion area patterns 12 serve as dams for confining and keeping back the conductive adhesive 6. This allows preventing defective appearance and electric defect of the semiconductor device 1.

Figure 4:
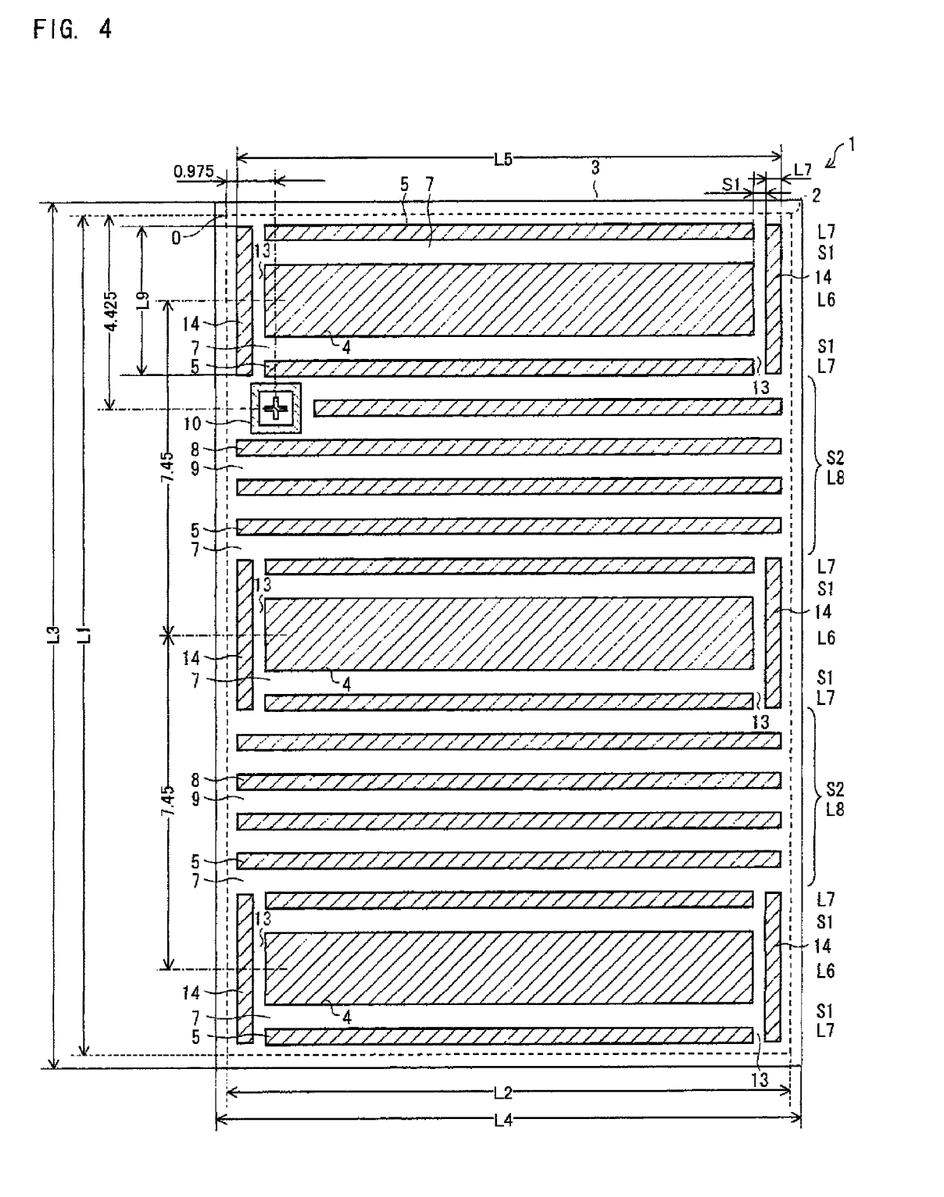
FIG. 4 is a plane drawing showing a semiconductor device in accordance with one Example of the present invention, having inter-pattern areas whose long sides are parallel to long sides of a substrate.

Instead of the inter-pattern areas 11 and the non-adhesion area patterns 12 shown in FIG. 3, inter-pattern areas 13 and non-adhesion area patterns 14 shown in FIG. 4 may be provided. The non-adhesion area patterns 14 are formed by lengthening the lengths of long sides of the non-adhesion area patterns 12. A length L9 of a long side of the non-adhesion area pattern 14 is L9=L6+2×S1+2×L7. A length of a short side of the non-adhesion area pattern 14 is L7.

The inter-pattern area 13 is provided between the adhesion area pattern 4 and the non-adhesion area pattern 14. A length of a long side of the inter-pattern area 13 is L9 and a length of a short side of the inter-pattern area 13 is S1.

As described above, by providing the inter-pattern areas 13 and the non-adhesion area patterns 14, not only the non-adhesion area patterns 5 but also the non-adhesion area patterns 14 serve as dams for confining and keeping back the conductive adhesive 6. This allows preventing defective appearance and electric defect of the semiconductor device 1.

In the semiconductor device 1, the inter-pattern area 7 may be a space for example. This allows the inter-pattern area 7 not only to confine and keep back the conductive adhesive 6 but also to be filled with resin when the semiconductor chip 2 is attached and sealed with resin.

Example 2

Figure 5:
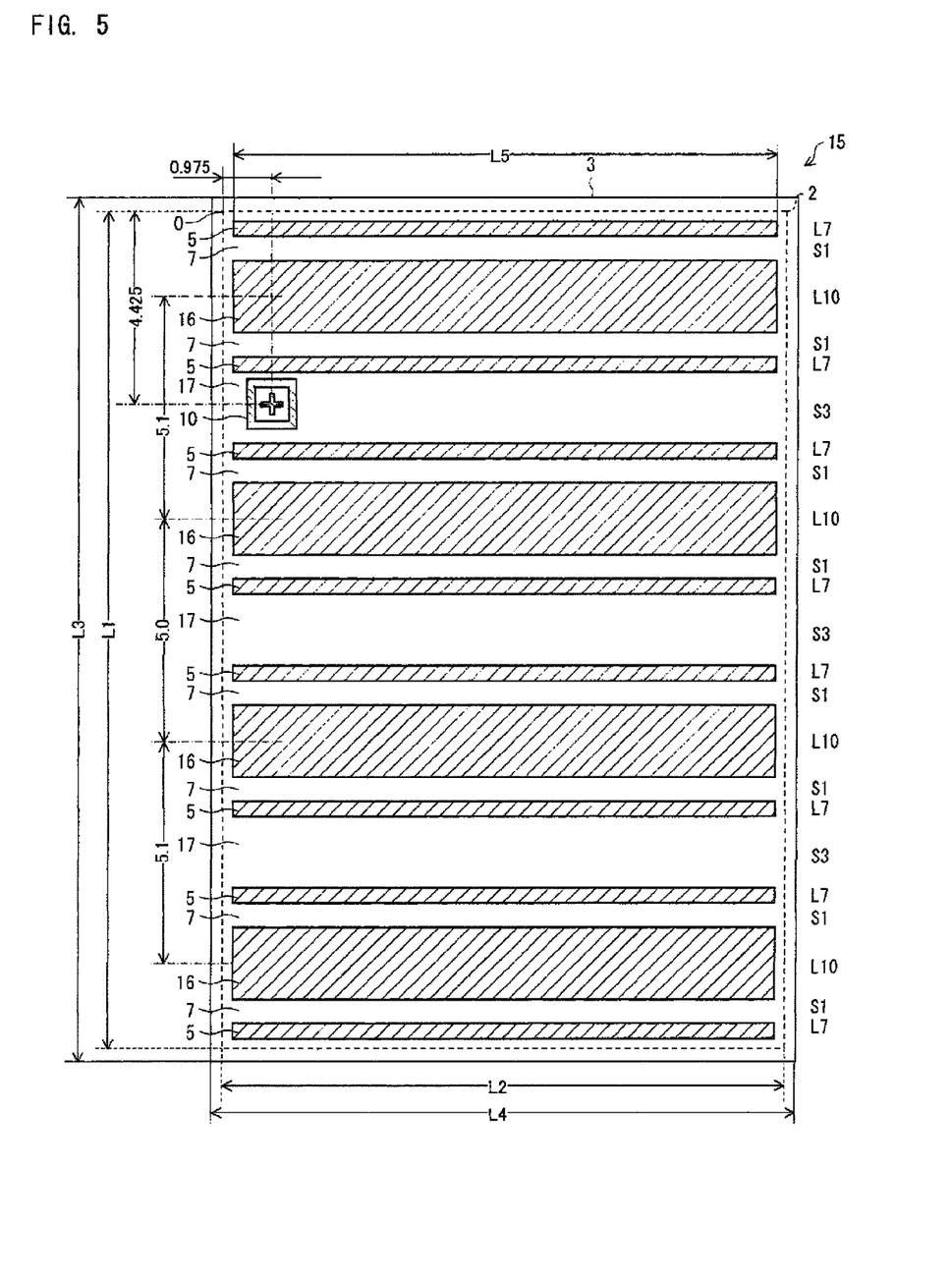
FIG. 5 is a plane drawing showing a semiconductor device in accordance with another Example of the present invention.

The following explains another Example of the present invention with reference to FIG. 5. In Example 2, configurations other than specifically explained below are the same as those in Example 1. For convenience of explanation, members having the same functions as those in the drawings of Example 1 are given the same reference numerals and explanations thereof are omitted here.

FIG. 5 is a plane drawing showing a semiconductor device 15 in accordance with Example 2. The semiconductor device 15 is different from the semiconductor device 1 in Example 1 in terms of patterns provided on the substrate 3.

In the semiconductor device in Example 1, three adhesion area patterns 4 are provided. Whereas in the semiconductor device 15, four adhesion area patterns 16 are provided. A length L10 of a short side of the adhesion area pattern 16 is 1.7 mm, which is shorter than the length L6=2 mm of a short side of the adhesion area pattern 4.

Between two successive adhesion area patterns 16, two non-adhesion area patterns 5 are provided. Between the two non-adhesion area patterns 5, an inter-pattern area 17 is provided. A length of a long side of the inter-pattern area 17 is L5, and a length S3 of a short side of the inter-pattern area 9 is S3=1.8 mm.

In the semiconductor device 15, when the area of the semiconductor chip 2 is regarded as 100%, the total of the areas of the adhesion area patterns 16 and the non-adhesion area patterns 5 is approximately 49%. Whereas in the substrate 102 in FIG. 8, the area of the pattern 104≈the area of the semiconductor chip 101=100%. Therefore, an area of a pattern subjected to gold plating that is stable in a steady state is smaller in the substrate 3 in FIG. 5 than in the substrate 102 in FIG. 8. Consequently, the substrate 3 in FIG. 5 allows reducing the costs compared with the substrate 102 in FIG. 8.

Further, in the semiconductor device 15, the conductive adhesive 6 in a liquid form is applied to only the adhesion area patterns 16. Consequently, in the semiconductor device 15 in FIG. 5, use of the expensive conductive adhesive 6 is reduced compared with a case of the semiconductor device 100 in FIG. 8. Therefore, the semiconductor device 15 in FIG. 5 allows reducing the costs.

Example 3

Figure 6:
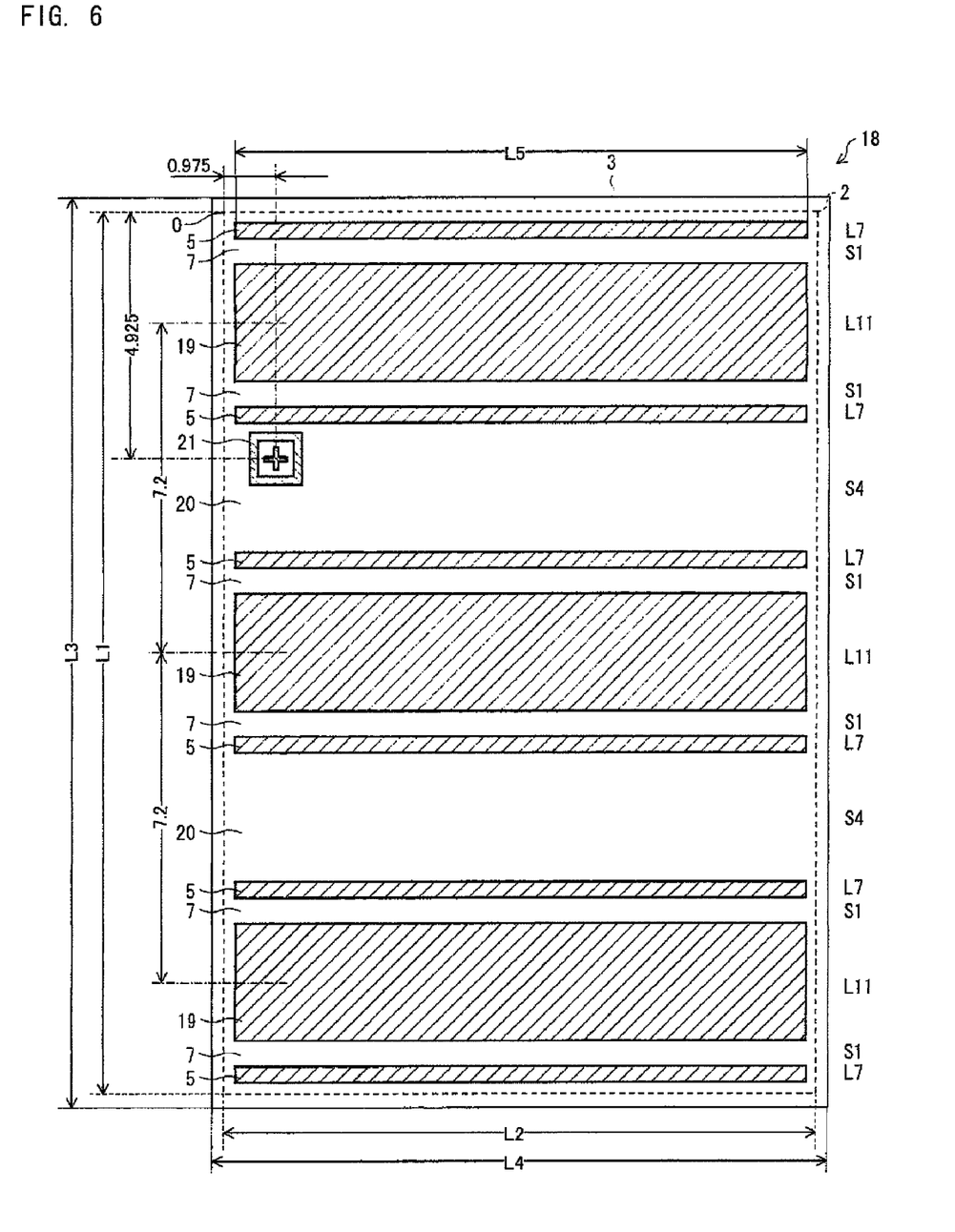
FIG. 6 is a plane drawing showing a semiconductor device in accordance with further another Example of the present invention.

The following explains further another Example of the present invention with reference to FIG. 6. In Example 3, configurations other than specifically explained below are the same as those in Examples 1 and 2. For convenience of explanation, members having the same functions as those in the drawings of Examples 1 and 2 are given the same reference numerals and explanations thereof are omitted here.

FIG. 6 is a plane drawing showing a semiconductor device 18 in accordance with Example 3. The semiconductor device 18 is different from the semiconductor device 1 in Example 1 in terms of patterns provided on the substrate 3.

Three adhesion area patterns 19 are provided on the substrate 3. Similarly with the adhesion area pattern 4, a length of a long side of the adhesion area pattern 19 is L5. A length L11 of a short side of the adhesion area pattern 19 is 2.5 mm, which is longer than the length L6 of a short side of the adhesion area pattern 4.

Two inter-pattern areas 7 are provided in such a manner as to be adjacent to two long sides, respectively, of each adhesion area pattern 19. The length of a long side of each inter-pattern area 7 is L5 and a length S1 of a short side of the inter-pattern area 7 is S1=0.5 mm.

Between two successive adhesion area patterns 19, two non-adhesion area patterns 5 are provided. Between the two non-adhesion area patterns 5, an inter-pattern area 20 is provided. A length of a long side of the inter-pattern area 20 is L5, and a length S4 of a short side of the inter-pattern area 20 is S4=3.1 mm.

Further, an alignment mark 21 is provided on the substrate 3 in such a manner that the center of the alignment mark 21 is positioned 4.925 mm away from a point O on the substrate 3 in a long side direction of the substrate 3 and 0.975 mm away from the point O in a short side direction of the substrate 3. The sizes of the alignment mark 21 are the same as those of the alignment mark 10 shown in (b) of FIG. 2.

In the semiconductor device 18, when the area of the semiconductor chip 2 is regarded as 100%, the total of the areas of the adhesion area patterns 19 and the non-adhesion area patterns 5 is approximately 50%. Whereas in the substrate 102 in FIG. 8, the area of the pattern 104≈the area of the semiconductor chip 101=100%. Therefore, an area of a pattern subjected to gold plating that is stable in a steady state is smaller in the substrate 3 in FIG. 6 than in the substrate 102 in FIG. 8. Consequently, the substrate 3 in FIG. 6 allows reducing the costs compared with the substrate 102 in FIG. 8.

Further, in the semiconductor device 18, the conductive adhesive 6 in a liquid form is applied to only the adhesion area pattern 19. Consequently, in the semiconductor device 18 in FIG. 6, use of the expensive conductive adhesive 6 is reduced compared with a case of the semiconductor device 100 in FIG. 8. Therefore, the semiconductor device 18 in FIG. 6 allows reducing the costs.

Example 4

Figure 7:
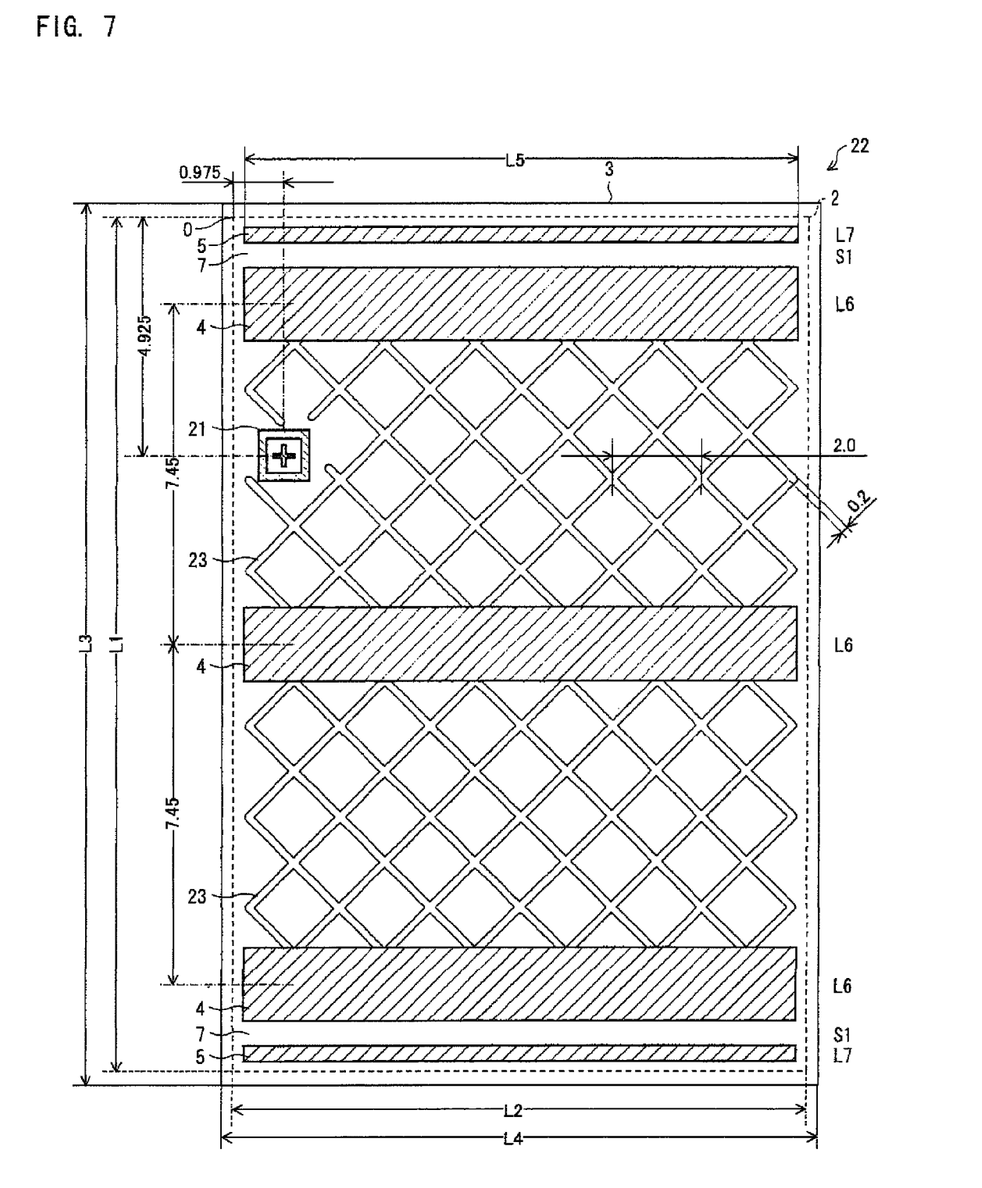
FIG. 7 is a plane drawing showing a semiconductor device in accordance with further another Example of the present invention.

The following explains further another Example of the present invention with reference to FIG. 7. In Example 4, configurations other than specifically explained below are the same as those in Examples 1-3. For convenience of explanation, members having the same functions as those in the drawings of Examples 1-3 are given the same reference numerals and explanations thereof are omitted here.

FIG. 7 is a plane drawing showing a semiconductor device 22 in accordance with Example 4. The semiconductor device 22 is different from the semiconductor device 1 in Example 1 in terms of patterns provided on the substrate 3 as follows.

In the semiconductor device 1 in Example 1, two non-adhesion area patterns 5 are provided between two successive adhesion area patterns 4. Between the two non-adhesion area patterns 5, four non-adhesion area patterns 8 and five inter-pattern areas 9 are provided alternately.

In contrast thereto, in the semiconductor device 22 in Example 4, mesh patterns 23 are provided between two successive adhesion area patterns 4. Each of the mesh patterns 23 has a thickness of 0.2 mm and a diagonal line with a length of 2 mm.

In the semiconductor device 22, the mesh patterns 23 are provided between the two successive adhesion area patterns 4, and an area where the mesh patterns 23 are provided cannot be sealed with resin. However, the mesh patterns 23 are favorable for preventing inconvenient breakage of the semiconductor chip 2 due to distortion of the semiconductor chip 2.

In the semiconductor device 22, when the area of the semiconductor chip 2 is regarded as 100%, the total of the areas of the adhesion area patterns 4, the non-adhesion area patterns 5, and the mesh patterns 23 is approximately 50%. Whereas in the substrate 102 in FIG. 8, the area of the pattern 104≈the area of the semiconductor chip 101=100%. Therefore, an area of a pattern subjected to gold plating that is stable in a steady state is smaller in the substrate 3 in FIG. 7 than in the substrate 102 in FIG. 8. Consequently, the substrate 3 in FIG. 7 allows reducing the costs compared with the substrate 102 in FIG. 8.

Further, in the semiconductor device 22, the conductive adhesive 6 in a liquid form is applied to only the adhesion area pattern 4. Consequently, in the semiconductor device 22 in FIG. 7, use of the expensive conductive adhesive 6 is reduced compared with a case of the semiconductor device 100 in FIG. 8. Therefore, the semiconductor device 22 in FIG. 7 allows reducing the costs.

In the Embodiment of the present invention, examples of the adhesion area patterns, the non-adhesion area patterns, and the mesh patterns include, but not limited to, metal patterns.

In the Embodiment of the present invention, the adhesion area patterns and the non-adhesion area patterns are rectangular. Alternatively, the adhesion area patterns and the non-adhesion area patterns may be square.

SUMMARY OF EMBODIMENT

The semiconductor device 1 of the present Embodiment includes: the semiconductor chip 2 having the chip electrode 30 on a backside of the semiconductor chip 2; and the substrate 3 having patterns on a surface of the substrate 3, the backside of the semiconductor chip 2 facing the surface of the substrate 3, the patterns including the adhesion area pattern 4 and the one or more non-adhesion area patterns 5, and the chip electrode 30 being attached to the adhesion area pattern 4 by the conductive adhesive 6.

With the arrangement, the patterns are not provided on a whole area of the substrate 3 which is substantially equal to the size of the semiconductor chip 2, and include the adhesion area pattern 4 and the one or more non-adhesion area patterns 5. Consequently, the total of areas of the adhesion area pattern 4 and the one or more non-adhesion area patterns 5 is smaller than an area of patterns provided on a whole area of the substrate which is substantially equal to the size of a conventional semiconductor chip.

Consequently, an area of patterns subjected to gold plating that is stable in a steady state is smaller in the substrate 3 than in a conventional substrate. Accordingly, the substrate 3 allows reducing costs compared with the conventional substrate.

Further, the chip electrode 30 provided on the backside of the semiconductor chip 2 is attached to the adhesion area pattern 4 by the conductive adhesive 6 in a liquid form. Accordingly, in the semiconductor device 1, the chip electrode 30 is attached to the adhesion area pattern 4 and at the same time use of the expensive conductive adhesive 6 is reduced compared with a case of a conventional semiconductor device. This allows reducing the costs.

The semiconductor device 1, 15, 18, 22 may be arranged so that inter-pattern areas 7, 11, 13 are provided in such a manner as to be adjacent to the adhesive area pattern 4, 16, 19, dam formation patterns, serving as the non-adhesion area patterns 5, 12, 14, are provided in such a manner as to be adjacent to the inter-pattern areas 7, 11, 13, and the adhesion area pattern 4, 16, 19 and each of the dam formation patterns are positioned in such a manner as to sandwich one of the inter-pattern areas 7, 11, 13.

The semiconductor device 1, 15, 18 may be arranged so that the adhesion area pattern 4, 16, 19 has a rectangular shape, two dam formation patterns, serving as the non-adhesion area patterns 5, are respectively provided outside of two facing long sides of the adhesion area pattern 4, 16, 19 having a rectangular shape, and each of the two dam formation patterns and the adhesion area pattern 4, 16, 19 have an inter-pattern area 7 therebetween.

The semiconductor device of the present invention may be arranged so that the adhesion area pattern 4 has a rectangular shape, four dam formation patterns, serving as the non-adhesion area patterns 5, 12, 14, are respectively provided outside of two facing long sides and two facing short sides of the adhesion area pattern 4 having a rectangular shape, and each of the four dam formation patterns and the adhesion area pattern 4 have an inter-pattern area 7, 11, 13 therebetween.

By providing the dam formation patterns as above, when the conductive adhesive 6 in a liquid form is applied to the adhesion area pattern 4, 16, 19, the conductive adhesive 6 leaking out of the adhesion area pattern 4, 16, 19 flows into the inter-pattern areas 7, 11, 13 and is blocked by the dam formation patterns each provided at a further side of the inter-pattern area 7, 11, 13 from the adhesion area pattern 4, 16, 19.

in this manner, the dam formation patterns serve as dams for confining and keeping back the conductive adhesive 6. Consequently, the conductive adhesive 6 does not flow out of the semiconductor chip 2. This allows preventing defective appearance of the semiconductor device and preventing electric defect caused by touching of an electrode outside the substrate 3 with the conductive adhesive 6.

The semiconductor device may be arranged so that the inter-pattern area 7, 11, 13 is a space.

This allows the inter-pattern area 7, 11, 13 not only to confine and keep back the conductive adhesive 6 but also to be filled with resin when the semiconductor chip 2 is attached and sealed with resin.

The semiconductor device 1, 15, 18 may be arranged so that the substrate 3 has a rectangular shape, the inter-pattern areas 7 have rectangular shapes provided in such a manner as to be adjacent to the two facing long sides of the adhesion area pattern 4, 16, 19, respectively, and long sides of each of the inter-pattern areas 7 are parallel to short sides of the substrate 3.

Consequently, the length of a long side of the inter-pattern area 7 having a rectangular shape is smaller than that in a case where a long side of the inter-pattern area 7 is parallel to a long side of the substrate 3. This allows more easily filling the inter-pattern areas 7 with resin, preventing a space from being made between the semiconductor chip 2 and the substrate 3.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention allows providing a semiconductor device made at lower costs by reducing both the costs of the substrate and use of a conductive adhesive. Accordingly, the semiconductor device of the present invention is preferably usable as a semiconductor device including a semiconductor chip having a chip electrode on a backside of the semiconductor chip.

REFERENCE SIGNS LIST 1, 15, 18, 22: Semiconductor device
2: Semiconductor chip
3. Substrate
4, 16, 19: Adhesion area pattern
5, 12, 14: Non-adhesion area pattern (non-adhesion area pattern, dam formation pattern)
6. Conductive adhesive
7, 11, 13: Inter-pattern area
8. Non-adhesion area pattern (non-adhesion area pattern)
9, 17, 20: Inter-pattern area
10, 21: Alignment mark
23: Mesh pattern
30: Chip electrode

The invention claimed is:

1. A semiconductor device, comprising: a semiconductor chip having one chip electrode on a backside of the semiconductor chip; and a substrate having patterns on a surface of the substrate, the backside of the semiconductor chip facing the surface of the substrate,
the patterns including a plurality of adhesion area patterns and one or more non-adhesion area patterns, and
the one chip electrode being attached to the plurality of adhesion area patterns by a conductive adhesive.

2. The semiconductor device as set forth in claim 1, wherein
inter-pattern areas are provided in such a manner as to be adjacent to one of the plurality of adhesion area patterns,
dam formation patterns, serving as the non-adhesion area patterns, are provided in such a manner as to be adjacent to the inter-pattern areas, and
said one of the plurality of adhesion area patterns and each of the dam formation patterns are positioned in such a manner as to sandwich one of the inter-pattern areas.

3. The semiconductor device as set forth in claim 2, wherein the inter-pattern area is a space.

4. The semiconductor device as set forth in claim 1, wherein
one of the plurality of adhesion area patterns has a rectangular shape,
two dam formation patterns, serving as the non-adhesion area patterns, are respectively provided outside of two facing long sides of said one of the plurality of adhesion area patterns which has a rectangular shape, and
each of the two dam formation patterns and said one of the plurality of adhesion area patterns have an inter-pattern area therebetween.

5. The semiconductor device as set forth in claim 4, wherein the inter-pattern area is a space.

6. The semiconductor device as set forth in claim 4, wherein
the substrate has a rectangular shape,
the inter-pattern areas have rectangular shapes provided in such a manner as to be adjacent to the two facing long sides of said one of the plurality of adhesion area patterns, respectively, and
long sides of each of the inter-pattern areas are parallel to short sides of the substrate.

7. The semiconductor device as set forth in claim 1, wherein
one of the plurality of adhesion area patterns has a rectangular shape,
four dam formation patterns, serving as the non-adhesion area patterns, are respectively provided outside of two facing long sides and two facing short sides of said one of the plurality of adhesion area patterns which has a rectangular shape, and
each of the four dam formation patterns and said one of the plurality of adhesion area patterns has an inter-pattern area therebetween.

8. The semiconductor device as set forth in claim 7, wherein the inter-pattern area is a space.

9. The semiconductor device as set forth in claim 7, wherein
the substrate has a rectangular shape,
the inter-pattern areas have rectangular shapes provided in such a manner as to be adjacent to the two facing long sides of said one of the plurality of adhesion area patterns, respectively, and
long sides of each of the inter-pattern areas are parallel to short sides of the substrate.

* * * * *